United States Patent
Noufi et al.

[11] Patent Number: 5,441,897
[45] Date of Patent: Aug. 15, 1995

[54] METHOD OF FABRICATING HIGH-EFFICIENCY CU(IN,GA)(SES)$_2$ THIN FILMS FOR SOLAR CELLS

[75] Inventors: Rommel Noufi, Golden; Andrew M. Gabor, Boulder; John R. Tuttle; Andrew L. Tennant, both of Denver; Miguel A. Contreras, Golden; David S. Albin, Denver; Jeffrey J. Carapella, Evergreen, all of Colo.

[73] Assignee: Midwest Research Institute, Kansas City, Mo.

[21] Appl. No.: 197,204

[22] Filed: Feb. 16, 1994

Related U.S. Application Data

[63] Continuation-in-part of Ser. No. 45,860, Apr. 12, 1993, Pat. No. 5,356,839.

[51] Int. Cl.$^6$ ............................................. H01L 31/18
[52] U.S. Cl. ......................................... 437/5; 437/108; 437/109; 437/234; 427/76; 136/264; 136/265
[58] Field of Search ............... 437/5, 108–109, 437/234; 427/76, 255.2, 255.7; 136/264, 265

[56] References Cited

U.S. PATENT DOCUMENTS

| | | | |
|---|---|---|---|
| 4,465,574 | 8/1984 | Love et al. | 204/192.26 |
| 4,652,332 | 3/1987 | Ciszek | 117/3 |
| 4,684,761 | 8/1987 | Devaney | 136/258 |
| 4,798,660 | 1/1989 | Ermer et al. | 204/192.17 |
| 4,818,357 | 4/1989 | Case et al. | 204/192.25 |
| 4,915,745 | 4/1990 | Pollock et al. | 136/265 |
| 5,045,409 | 9/1991 | Eberspacher et al. | 428/620 |
| 5,141,564 | 8/1992 | Chen et al. | 136/258 |
| 5,356,839 | 10/1994 | Tuttle et al. | 437/225 |

Primary Examiner—Aaron Weisstuch
Attorney, Agent, or Firm—Edna M. O'Connor

[57] ABSTRACT

A process for producing a slightly Cu-poor thin film of Cu(In,Ga)(Se,S)$_2$ comprises depositing a first layer of (In,Ga)$_x$(Se,S)$_y$ followed by depositing just enough Cu+(Se,S) or Cu$_x$(Se,S) to produce the desired slightly Cu-poor material. In a variation, most, but not all, (about 90 to 99%) of the (In,Ga)$_x$(Se,S)$_y$ is deposited first, followed by deposition of all the Cu+(Se,S) or Cu$_x$(Se,S) to go near stoichiometric, possibly or even preferably slightly Cu-rich, and then in turn followed by deposition of the remainder (about 1 to 10%) of the (In,Ga)$_x$(Se,S)$_y$ to end with a slightly Cu-poor composition. In yet another variation, a small portion (about 1 to 10%) of the (In,Ga)$_x$(Se,S)$_y$ is first deposited as a seed layer, followed by deposition of all of the Cu+(Se,S) or Cu$_x$(Se,S) to make a very Cu-rich mixture, and then followed deposition of the remainder of the (In,Ga)$_x$(Se,S)$_y$ to go slightly Cu-poor in the final Cu(In,Ga)(Se,S)$_2$ thin film.

27 Claims, 2 Drawing Sheets

METHOD OF FABRICATING HIGH-EFFICIENCY CU(IN,GA)(SES)$_2$ THIN FILMS FOR SOLAR CELLS

CONTRACTUAL ORIGIN OF THE INVENTION

The United States Government has rights in this invention under Contract No. DE-AC0283CH10093 between the U.S. Department of Energy and the National Renewable Energy Laboratory, a Division of Midwest Research Institute.

CROSS REFERENCE TO RELATED APPLICATIONS

This patent application is a continuation-in-part of U.S. patent application Ser. No. 08/045,860, filed on Apr. 12, 1993, now U.S. Pat. No. 5,356,839 entitled "Enhanced Quality Thin film Cu(In,Ga)Se$_2$ for Semiconductor Device Applications by Vapor-Phase Recrystallization."

BACKGROUND OF THE INVENTION

1. Field of the Invention

The present invention is related generally to preparation of thin film compounds and more particularly to preparing thin film compounds of Cu(In,Ga)(Se,S)$_2$ in semiconductor devices.

2. Description of the Prior Art

Thin films of copper-indium-diselenide (CuInSe$_2$), copper-gallium-diselenide (CuGaSe$_2$), and copper-indium-gallium-diselenide (CuIn$_{1-x}$Ga$_x$Se$_2$), all of which are sometimes generically referred to as Cu(In,Ga)Se$_2$, have become the subject of considerable interest and study for semiconductor devices in recent years. Sulfur can also be, and sometimes is, substituted for selenium, so the compound is sometimes also referred to even more genetically as Cu(In,Ga)(Se,S)$_2$ to comprise all those possible combinations. They are of particular interest for photovoltaic device or solar cell absorber applications because of solar energy to electrical energy conversion efficiencies that have, prior to this invention, been shown to exceed fifteen percent (15%) in active areas and to approach fourteen percent (14%) in total areas, which is quite high for current state-of-the-art solar cell technologies, where the theoretical efficiency limit for this type of thin film solar cell is about 23% to 25%. Prior to this invention, which has demonstrated a new world record for light to electrical energy conversion efficiency of 16.4%, the previous world record was 14.9% set by a European University consortium in January 1993.

It has been generally believed by persons skilled in this art that the best electronic device properties, thus the best conversion efficiencies, are obtained when the mole percent of copper is about equal to the mole percent of the indium, the gallium, or the combination of the indium and gallium in the Cu(In,Ga)Se$_2$ compound or alloy. The selenium content will not generally be important to the electronic properties of the semiconductor if the growth conditions supply sufficient selenium so that it comprises about fifty atomic percent (50 at. %) of the Cu(In,Ga)(Se,S)$_2$ compound to form the desired crystal lattice structures.

While growth of single crystal CuInSe$_2$ has been studied, such as in the U.S. Pat. No. 4,652,332, issued to T. Ciszek, the use of polycrystalline thin films is really more practical. Sputter depositing a ternary single phase CuInSe$_2$ layer, including the ability to determine the properties of the thin film, such as multilayer structures, by varying the sputter process parameters, is described by the U.S. Pat. No. 4,818,357, issued to Case et al. However, the two fabrication methods of choice are: (1) Physical vapor deposition of the constituent elements, exemplified by the process disclosed in the U.S. Pat. No. 5,141,564, issued to Chen et al., is generally used as a research tool; and (2) The selenization of Cu/In metal precursors by either H$_2$Se gas or Se vapor. The selenization technology generally exemplified by the processes described in the U.S. Pat. No. 4,798,660, issued to Ermer et al., the U.S. Pat. No. 4,915,745, issued to Pollock et al., and the U.S. Pat. No. 5,045,409, issued to Eberspacher et al., is currently favored for manufacturing processes. However, thin films produced by the selenization processes usually suffer from macroscopic spatial nonuniformities that degrade performance and yield, and reproducible consistent quality from run to run is difficult to obtain and unpredictable. Therefore, working with Cu(In,Ga)(Se,S)$_2$ material has still been difficult, particularly when scaling up, so it has yet to be commercialized.

SUMMARY OF THE INVENTION

Accordingly, it is a general object of this invention to provide a process that produces a better quality Cu(In,Ga)(Se,S)$_2$ thin film more consistently and more predictably than previously known processes.

Still another object of this invention is to provide a process for producing high quality Cu(In,Ga)Se$_2$ thin films that does not require precise control of the ratio of Cu/(In,Ga), thus can be scaled up easily to production of large areas and to commercial quantities.

A more specific object of the present invention is to provide a method for producing higher efficiency Cu(In,Ga)(Se,S)$_2$ thin films for use as absorbers in solar cell applications than have been produced before.

Additional objects, advantages, and novel features of the present invention shall be set forth in part in the description that follows, and in part will become apparent to those skilled in the art upon examination of the following or may be learned by the practice of the invention or may be realized and attained by means of the instrumentalities and in combinations particularly pointed out in the appended claims.

To achieve the foregoing and other objects and in accordance with the purpose of the present invention, as embodied and broadly described herein, the method of this invention may comprise the steps of forming slightly Cu-poor thin films of Cu(In,Ga)(Se,S)$_2$ according to one or more of three process embodiments. The first embodiment process comprises sequential deposition of all the (In,Ga)$_x$(Se,S)$_y$ required to produce the desired slightly Cu-poor Cu(In,Ga)(Se,S)$_2$ thin film followed by-deposition of all the Cu$_x$(Se,S) required. Substrate temperature during deposition of the (In,Ga)$_x$(Se,S)$_y$ is in the range of ambient to 600° C. (preferably about 260° C.), while deposition of the Cu$_x$(Se,S) is in the range of 350° C. to 1,200° C. (preferably about 565° C.).

The second embodiment process is substantially similar to the first embodiment, except that step of depositing all the Cu$_x$(Se,S) is preceded by deposition of most, but not all, (about 90 to 99%) of the (In,Ga)$_x$(Se,S)$_y$ and followed by the deposition of the remainder (about 1 to 10%) of the (In,Ga)$_x$(Se,S)$_y$. Therefore, the composition goes from Cu-poor to near stoichiometric, possibly or even preferably, slightly Cu-rich, during deposition of the $Cu_x(Se,S)$ and then ending with slightly Cu-poor composition with the completion of the deposition of the remainder of the $(In,Ga)_x(Se,S)_y$.

In the third embodiment process, a small portion (about 1 to 10%) of the $(In,Ga)_x(Se,S)_y$ is first deposited as a seed layer, followed by deposition of all the $Cu_x(Se,S)$, which in turn is followed by deposition of the remainder (about 90 to 99%) of the $(In,Ga)_x(Se,S)_y$ required to produce a slightly Cu-poor thin film of $Cu(In,Ga)(Se,S)_2$.

BRIEF DESCRIPTION OF THE DRAWINGS

The accompanying drawings, which are incorporated in and form a part of the specification, illustrate the preferred embodiments of the present invention, and together with the description serve to explain the principles of the invention.

In the Drawings

DETAILED DESCRIPTION OF THE PREFERRED EMBODIMENTS

The processes of the present invention comprise essentially two or three steps, depending on the embodiment or variation being used, for fabricating high-quality thin film $Cu(In,Ga)(Se,S)_2$-based semiconductor devices that have photovoltaic effects and are especially adaptable for solar cell applications. For purposes of simplicity, the description of the processes and claims of this invention will focus primarily on $CuInSe_2$- based structures. However, it should be understood that Ga or various combinations of $In_{1-x}Ga_x$ may be substituted for the In component, and that S or various combinations of $Se_{1-y}S_y$ may be substituted for the Se component described in these processes and that such substitutions are considered to be equivalents for purposes of this invention. Also, as mentioned above, where several elements can be combined with or substituted for each other, such as In and Ga, or Se and S, in the component to which this invention is related, it is not uncommon in this art to include those combinable or interchangeable elements in a set of parentheses, such as (In,Ga) or (Se,S). The descriptions in this specification sometimes utilize this convenience. Finally, also for convenience, the elements are discussed with their commonly accepted chemical symbols, including copper (Cu), indium (In), gallium (Ga), selenium (Se), sulfur (S), hydrogen (H), and molybdenum (Mo), and the like.

The processes of the present invention include utilization of steps involving fluxes or depositions of Cu, (In,Ga), (Se,S), $Cu_x(Se,S)$, or $(In,Ga)_x(Se,S)_y$. As is well-recognized in this art, fluxes or depositions of the binary forms of these elements, such as $Cu_x(Se,S)$, $(In,Ga)_x(Se,S)_y$, $In_x(Se,S)_y$, or $Ga_x(Se,S)_y$ instead of the individual elemental forms of Cu, (In,Ga), or (Se,S), or vice versa, are considered to be suitable substitutes and are equivalents for purposes of this invention.

Figure 1:
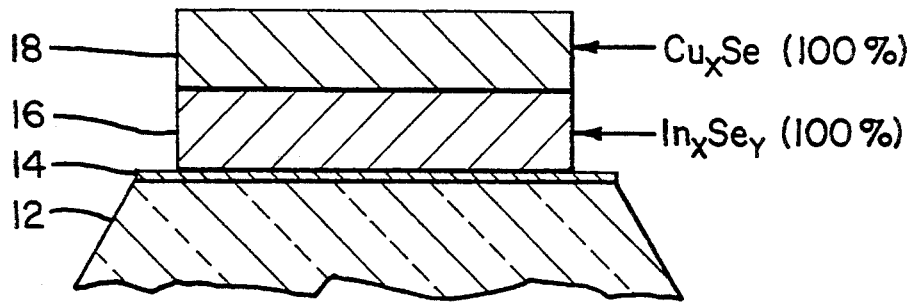
FIG. 1 is a conceptual process step diagram of a first embodiment thin film fabrication step according to this invention.

Referring now to FIG. 1, in the first embodiment, the process according to this invention may start with a first stage by depositing a first layer of $In_xSe_y$ on a substrate 12. The substrate 12 may be, for example, soda-lime silica glass or amorphous 7059 glass with a smooth metallic back contact surface 14, such as about one micron layer of molybdenum (Mo) or other appropriate metal. The deposition of the first layer 16 of $In_xSe_y$ may be by any of a variety of common techniques, such as evaporation, sputtering, electrodeposition, chemical vapor deposition, or the like. Furthermore, as discussed above, the formation of the $In_xSe_y$ in this first layer 16 can be done by either co-deposition or sequential deposition of the In and Se, or by deposition from the binary compounds, such as $In_2Se_3$ or InSe. It is important, however, to keep track of, or know, the thickness of the $In_xSe_y$ layer 16 deposited in this first stage, because it is important in proportioning the materials deposited in the second stage, as will be described in more detail below. Finally, the substrate 12 temperature can be anywhere from ambient or room temperature to about 600° C., but is preferably in the range of about 260° C. during deposition of the first layer 16 of $In_xSe_y$.

Once the first layer 16 of $In_xSe_y$ is deposited on the substrate 12, the process can proceed to the second stage in which Cu is added. The second stage starts by raising the temperature of the substrate 12 and first layer 16 of $In_xSe_y$ to at least 350° C., but preferably to about 565° C. Actually, the $In_xSe_y$ of layer 16 is not liquid, so even higher temperatures, such as 350° C. to 1000° C. to 1,200° C., are feasible depending on the composition and ability of the substrate 12 to withstand such temperatures. However, where the substrate 12 comprises soda lime glass, as suggested above as one preferred option, 600° C. is about as high as the temperature should be raised for the second stage deposition process. In any event, a vapor pressure or flux of Se should be maintained at the substrate 12 as the temperature is being raised in order to keep from losing the In from the $In_xSe_y$ layer 16. Specifically, $In_2Se$ has a high vapor pressure and will evaporate as the temperature increases. Therefore, a vapor over-pressure of Se is used to prevent $In_2Se$ from forming in the $In_xSe_y$ layer 16 and evaporating.

Figure 4:
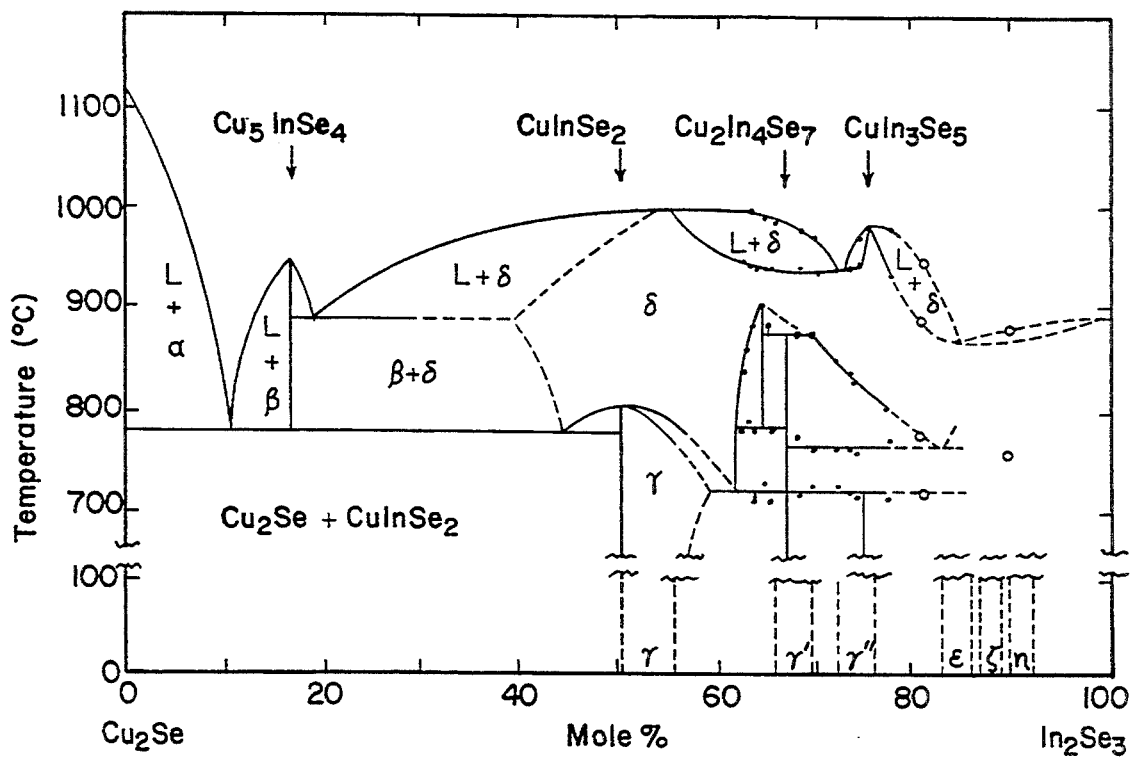
FIG. 4 is a $Cu_2Se$-$In_2Se_3$ pseudobinary phase diagram that is useful in describing and understanding the processes of the present invention.

When the substrate 12 temperature reaches the desired level, such as 565° C., Cu and Se are deposited at the surface of layer 16 until the overall composition of the film is slightly Cu-poor. In other words, referring to the pseudobinary phase diagram of FIG. 4, the film composition starts out with the $In_xSe_y$ layer 16 comprising no Cu, thus is at the far right side of the mole % scale of FIG. 4. As Cu and Se are deposited in this second stage, as indicated conceptually at 18 in FIG. 1, the composition of the resulting thin film moves to the left on the mole % scale in FIG. 4. Deposition of the Cu is stopped just before the composition reaches the 50% point on the mole % scale, thereby leaving the composition just slightly Cu-poor, such that the Cu/In ratio is in the range of about 0.8 to 0.99.

In the second stage 18, the source for the Cu can be the binary $Cu_xSe$ or the elemental Cu and Se, as discussed above. In reality the second stage deposition of Cu and Se does not, of course, remain in a distinct $Cu_xSe$ layer 18, as depicted in FIG. 1. Instead, the composition becomes a homogenous thin film composition of substantially CuInSe$_2$ that is just slightly Cu-poor, which has been found to be the most efficient solar radiation to electricity converting composition according to this invention. However, in planning the sequential depositions of the respective first and second stages, as described above, it is helpful to conceptualize them as sequential depositions of a first layer 16 of In$_x$Se$_y$ followed by a second layer 18 of Cu$_x$Se, even though the layers 16 and 18 do not actually remain separate or discrete compositions.

When the appropriate amount of Cu and Se has been deposited to attain the desired composition, as described above, the deposition of Cu is stopped, and the substrate 12 is then cooled slowly. The Se flux is maintained over the substrate 12 and the deposited thin film until the temperature drops at least down to about 350° C. to prevent loss of In as described above. The temperature is preferably dropped at a rate of about 5° to 30° per minute. When the temperature drops lower than about 350° C., the Se flux can be turned off and the deposition is complete.

EXAMPLE I

Deposition of a CuInSe$_2$ film on a soda-lime silica glass substrate with a one-micron back contact layer of Mo was begun by evacuating the deposition chamber to establish a base pressure less than $3 \times 10^{-6}$ torr. After heating the substrate in the chamber to 260° C., In was co-evaporated with Se. The flux rates for the In and Se were held at 4.4 Å/s and 14 Å/s, respectively, until 7,550 Å of In was deposited. After the In deposition, the Se flux rate was held at 15 Å/s while the substrate temperature was ramped at 1° C./s to 565° C. The flux rate of Se was then raised and held at 17 Å/s while 3,100 Å of Cu was deposited at a rate of 2.4 Å/s. After the Cu was deposited, the sample was cooled at 12° C./s down to 350° C., while the Se flux was continued at 15 Å/s. The Se flux rate was then brought to zero, and the sample was allowed to cool naturally to room temperature. The resulting CuInSe$_2$ film was slightly Cu-poor with a Cu/In ratio of about 0.96. Subsequent testing of the example demonstrated light to electrical energy conversion efficiency of 10.7%.

EXAMPLE II

A CuIn$_{1-x}$Ga$_x$Se$_2$ film was prepared on a soda-lime silica glass substrate with a Mo back contact under substantially the same conditions and procedures as Example I, except that In, Ga, and Se were co-evaporated at flux rates of 4.4 Å/s, 0.6 Å/s, and 19 Å/s, respectively, until 5,850 Å of In and 2,000 Å of Ga were deposited. The resulting CuIn$_{0.83}$Ga$_{0.17}$Se$_2$ was slightly Cu-poor with a Cu/(In,Ga) ratio of 0.92. Subsequent tests demonstrated light to electrical energy conversion efficiency of 11.3%.

Figure 2:
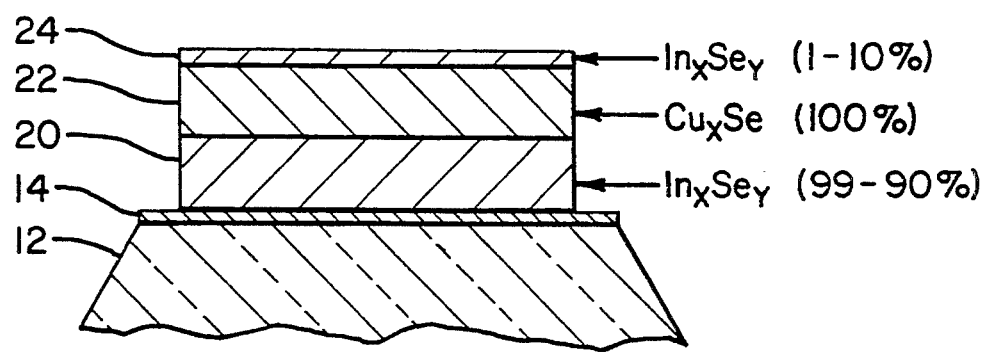
FIG. 2 is a conceptual process step diagram of a second embodiment thin film fabrication step according to this invention.

The second embodiment process of this invention is illustrated conceptually in FIG. 2. Rather than sequentially depositing 100% of the In$_x$Se$_y$ followed by depositing 100% of the Cu$_x$Se in two stages, as was done in the first embodiment described above, this second embodiment instead accomplishes the deposition of the desired slightly Cu-poor CuInSe$_2$ in three stages. In the first stage, a layer 20 comprising slightly less than all of the planned In$_x$Se$_y$ necessary to achieve the final slightly Cu-poor CuInSe$_2$ is deposited. For example, about 90% to 99% of the needed In$_x$Se$_y$ is deposited in the first layer 20, as illustrated in FIG. 2.

In the second stage of the second embodiment process, all (100%) of the Cu$_x$Se needed for the final slightly Cu-poor CuInSe$_2$ thin film composition is deposited, as illustrated at 22 in FIG. 2. As discussed above, the deposited Cu$_x$Se layer 22 does not stay segregated from the initial In$_x$Se$_y$ layer 20. Instead they form a homogenous thin film composition. Consequently, since not all of the In$_x$Se$_y$ is deposited in the initial stage on layer 20, the deposition of all the Cu$_x$Se in the second stage 22 will move the composition from the extreme right side of the mole % scale in FIG. 4 back to the left enough to go to a near stoichiometric composition, which can be slightly to the right or left of the 50% mark of stoichiometric CuInSe$_2$ in FIG. 4. For the purposes of this invention, "near stoichiometric" is considered to be in the range of about $0.90 < \text{Cu}/\text{In} < 1.2$. Then, in the third stage 24, after all the Cu$_x$Se has been deposited in the second stage 22, the remainder (i.e., 1 to 10%) of the In$_x$Se$_y$ is deposited to move the composition more to the right, such that the resulting composition is to the right of the 50% mark on the mole % scale of FIG. 4 to result in the desired slightly Cu-poor CuInSe$_2$ composition.

Other than dividing the deposition process into the three sequential stages 20, 22, 24, as described above, the deposition techniques, temperatures, and other parameters can be substantially the same as those described above for the first embodiment process of this invention.

While the ultimate composition of the slightly Cu-poor CuInSe$_2$ thin film produced according to the second embodiment process of this invention is substantially the same as the slightly Cu-poor CuInSe$_2$ thin film produced by the first embodiment process described above, there can be a small amount of phase separation if the composition of the second embodiment process goes slightly Cu-rich with the stoichiometric composition of Cu(In,Ga)(Se,S)$_2$ with about $1.01 < \text{Cu}/(\text{In,Ga}) < 1.2$ toward the end of the second stage 22. Specific examples have produced films wherein the near stoichiometric composition comprises a ratio of Cu/(In,Ga) of about 1.02 and CuInSe$_2$, with no Ga and a ratio of Cu/In of about 1.08. While such phase separation is reversed when the composition goes back to slightly Cu-poor during the third stage deposition 24, this transition seems to produce a better quality film with better photovoltaic properties. Even if the composition at the end of the second stage 22 does not become Cu-rich, the addition of the third stage 24 produced a better quality film than if the third stage is not implemented.

Figure 5:
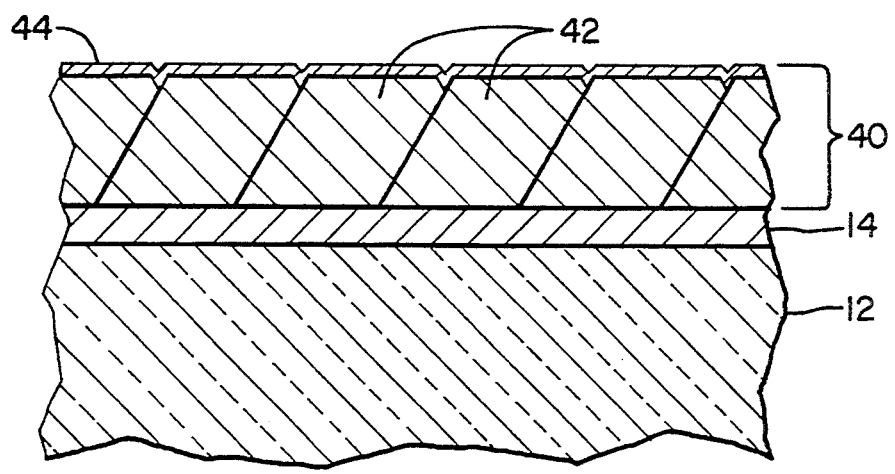
FIG. 5 is an enlarged cross-sectional view of a portion of a $Cu(In,Ga)(Se,S)_2$ film produced according to this invention.

While it is not completely understood why the thin films produced according to this second embodiment have better photovoltaic properties, it is believed that the surface or "skin" of the grains 44 comprising the thin film 40, as illustrated in FIG. 5, differs in composition from the bulk of the grains 42. The bulk of each grain 42 is close to stoichiometric, while the surface or "skin" grains 44 has very Cu-poor composition, such as Cu$_1$In$_3$Se$_5$, or if Ga is included possibly Cu$_1$(In,Ga)$_5$Se$_8$.

EXAMPLE III

Deposition of a CuInSe$_2$ film on a soda-lime silica glass substrate with a Mo back contact layer was begun by evacuating the deposition chamber to establish a base pressure less than $3 \times 10^{-6}$ torr. After heating the substrate in the chamber to 260° C., In was co-evaporated with Se. The flux rates for the In and Se were held at 4.4 Å/s and 14 Å/s, respectively, until 6,800 A Å of In were deposited. After the In deposition, the Se flux rate was held at 15 Å/s while the substrate temperature was ramped at 1° C./s to 565° C. The flux rate of Se was then raised and held at 17 Å/s while 3,100 Å of Cu was deposited at a rate of 2.4 Å/s. After the Cu deposition, a third layer of In was deposited at a rate of 4.4 Å/s while holding the Se flux rate at 14 Å/s until an additional 750 Å of In was deposited. The sample was then cooled at the rate of 12° C./s to 350° C. while holding the Se flux rate at 15 Å/s. When the sample was cooled to 350° C., the Se flux rate was taken to zero, and the sample was allowed to cool naturally to room temperature. The resulting $CuInSe_2$ film was slightly Cu-poor with a Cu/In ratio of about 0.96. Subsequent testing of the example demonstrated light to electrical energy conversion efficiency of 13.2%.

EXAMPLE IV

A $CuIn_{1-x}Ga_xSe_2$ film was prepared on a soda-lime silica glass substrate with a Mo back contact under substantially the same conditions and procedures as Example III, except that In, Ga, and Se were co-evaporated at flux rates of 4.4 Å/s, 1.5 Å/s, and 23 Å/s, respectively, in the first phase until 5,300 Å of In and 1,800 Å of Ga were deposited. Then, after the second stage deposition of 3,100 Å of Cu was completed, the third stage was accomplished by co-evaporation of In, Ga, and Se at respective flux rates of 4.4 Å/s, 1.5 Å/s, and 23 Å/s until an additional 600 Å of In and an additional 200 Å of Ga were deposited. The resulting $CuIn_{0.74}Ga_{0.26}Se_2$ was slightly Cu-poor with a Cu/(In, Ga) ratio of 0.92. This example produced a world record total-area light to electrical energy conversion efficiency of 16.4%.

Figure 3:
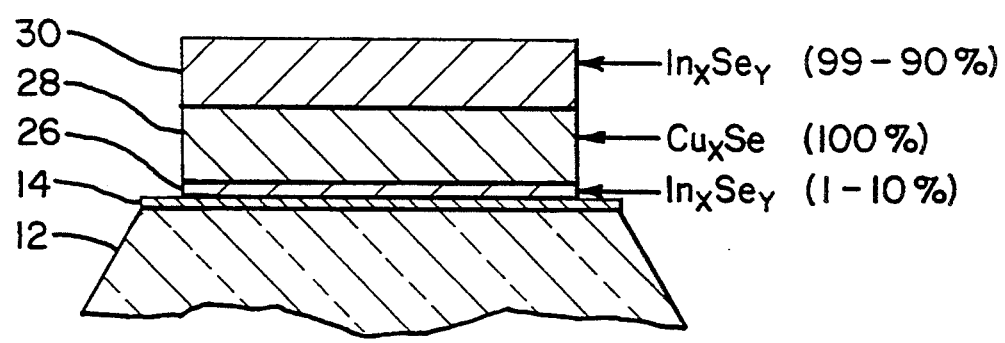
FIG. 3 is a conceptual process step diagram of a third embodiment thin film fabrication step according to this invention.

The third embodiment process of this invention is also a three stage process, as illustrated in FIG. 3. However, the three stages 26, 28, 30 of this third embodiment are in a sense the reverse of the three phases 20, 22, 24 of the second embodiment. In the third embodiment process, a first seed layer of $In_xSe_y$ is deposited on the Mo layer 14 of the substrate 12 to a depth of about 100 to 1,000 Å at about 260° C. This first seed layer 26 of $In_2Se_y$ comprises about 1 to 10% of the total $In_xSe_y$ to be deposited in the production of the desired slightly Cu-poor $CuInSe_2$ thin film. It is followed by a second stage 28 deposition of all or 100% of the $Cu_xSe_y$ needed to produce the desired Cu-poor thin film. The $Cu_xSe$ deposition can be, for example, from $Cu+Se$ or $Cu_xSe_y$ bulk. The second stage 28 deposition of $Cu_xSe$ will obviously produce a very Cu-rich composition of $10<Cu(In,Ga)<100$ throughout most of the second stage 28 due to the much larger quantity of $Cu_xSe$ than the seed layer 26 of $In_xSe_y$. The very Cu-rich composition was also produced with Cu/(In,Ga) of about 10. However, the remainder (i.e., 90 to 99%) of the $In_xSe_y$ needed is deposited in the third stage 30, which is just enough to shift the composition to slightly Cu-poor on the mole % scale of FIG. 4, as desired for the best quality and highest efficiency $CuInSe_2$ thin films. The slightly Cu-poor film has a composition of about $0.8<Cu/(In,Ga)<0.99$.

Again, other than the specific proportions of the three stages 26, 28, 30 of this third embodiment process of this invention, the other process parameters can be substantially the same as those described above for the first and second embodiments.

EXAMPLE V

Deposition of a $CuInSe_2$ film on a soda-lime silica glass substrate with a Mo back contact layer was begun by evacuating the deposition chamber to establish a base pressure less than $3\times10^{-6}$ torr. After heating the substrate to 260° C., In was co-evaporated with Se. The flux rates for the In and Se were held at 4.4 Å/s and 27 Å/s, respectively, until 650 Å of In was deposited. After the $In_xSe_y$ seed layer deposition, the Se flux rate was held at 15 Å/s while the substrate temperature was ramped at 1° C./s to 565° C. The flux rate of Se was then raised and held at 28 Å/s while 2,500 Å of Cu was deposited at a rate of 4.0 Å/s. After the Cu deposition, a third layer of In was deposited at a rate of 4.4 Å/s while holding the Se flux rate at 27 Å/s until an additional 6,000 Å of In was deposited. The sample was then cooled at the rate of 12° C./s to 350° C. while holding the Se flux rate at 15 Å/s. When the sample was cooled to 350° C. the Se flux rate was taken to zero, and the sample was allowed to cooled naturally to room temperature. The resulting $CuInSe_2$ film was slightly Cu-poor with Cu/In ratio of about 0.96. Subsequent testing of the example demonstrated light to electrical energy conversion efficiency of 7.1%. Slightly Cu-poor thin films were also produced with a Cu/(In,Ga) ratio of about 0.92.

The foregoing description is considered as illustrative only of the principles of the invention. Further, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

The embodiments of the invention in which an exclusive property or privilege is claimed are defined as follows:

1. A process for fabricating thin film semiconductor devices, comprising the steps of:
   depositing a layer of $(In,Ga)_x(Se,S)_y$ on a substrate, and
   depositing a sufficient amount of $Cu+(Se,S)$ or $Cu_x(Se,S)$ onto the layer of $(In,Ga)_x(Se,S)_y$ to produce a slightly Cu-poor thin film of $Cu(In,Ga)(Se,S)_2$ on the substrate wherein said slightly Cu-poor thin film comprises a ratio of Cu to (In,Ga) in the range of about $0.8<Cu/(In,Ga)<0.99$.

2. The process of claim 1, including the steps of depositing said layer of $(In,Ga)_x(Se,S)_y$ at a temperature in the range of ambient to 600° C.

3. The process of claim 1, including the step of depositing said layer of $(In,Ga)_x(Se,S)_y$ at a temperature of about 260° C.

4. The process of claim 1, including the step of depositing said $Cu+(Se,S)$ or $Cu_x(Se,S)$ at a temperature in the range of about 350° C. to 1,200° C.

5. The process of claim 1, including the step of depositing said $Cu+(Se,S)$ or $Cu_x(Se,S)$ at a temperature in the range of about 350° C. to 1,000° C.

6. The process of claim 1, including the step of depositing said $Cu+(Se,S)$ or $Cu_x(Se,S)$ at a temperature in the range of about 565° C.

7. The process of claim 1, including the step of holding a flux of (Se,S) to said substrate and thin film after stopping deposition of said Cu or $Cu_x(Se,S)$ while cooling said substrate and said thin film down to a temperature of about 350° C.

8. The process of claim 1 wherein said slightly Cu-poor thin film comprises $CuInSe_2$ with no Ga and has a composition ratio of Cu/In of about 0.96.

9. The process of claim 1 wherein said slightly Cu-poor thin film comprises a composition ratio of (Cu/In,Ga) of about 0.92.

10. A process for fabricating thin film semiconductor devices, comprising the steps of:
    depositing a layer of $(In,Ga)_x(Se,S)_y$ on a substrate;
    depositing a sufficient amount of $Cu+(Se,S)$ or $Cu_x(Se,S)$ on said layer of $(In,Ga)_x(SeS)_y$ to produce a near stoichiometric composition of $Cu(In,Ga)(Se,S)_2$ thin film wherein said near stoichiometric composition comprises about $0.9 < Cu/(In,Ga) < 1.2$;
    depositing enough additional $(In,Ga)+(Se,S)$ on said near stoichiometric composition to change said thin film to a slightly Cu-poor composition of $Cu(In,Ga)(Se,S)_2$ wherein said slightly Cu-poor film comprises a composition of about $0.8 < Cu/(In,Ga) < 0.99$.

11. The method of claim 10 wherein said near stoichiometric composition comprises $CuInSe_2$ with no Ga and has a ratio of Cu/In of about 1.08.

12. The method of claim 10, wherein said near stoichiometric composition comprises a ratio of Cu/(In,Ga) of about 1.02.

13. The method of claim 10, wherein said slightly Cu-poor composition comprises $CuInSe_2$ with no Ga and has a Cu/In ratio of about 0.96.

14. The method of claim 10, wherein said slightly Cu-poor composition comprises a Cu/(In,Ga) ratio of about 0.92.

15. The method of claim 10, wherein said near stoichiometric composition of $Cu(In,Ga)(Se,S)_2$ is slightly Cu-rich with about $1.01 < Cu/(In,Ga) < 1.2$.

16. The process of claim 10, wherein said layer of $(In,Ga)_x(Se,S)_y$ is deposited at a temperature in the range of about ambient to 600° C.

17. The process of claim 10, wherein said layer of $(In,Ga)_x(Se,S)_y$ is deposited at a temperature of about 260° C.

18. The process of claim 10, wherein said $Cu+(Se,S)$ or $Cu_x(Se,S)$ is deposited at a temperature in the range of about 350° C. to 1,200° C.

19. The process of claim 10, wherein said $Cu+(Se,S)$ or $Cu_x(Se,S)$ is deposited at a temperature in the range of about 350° C. to 1,000° C.

20. The process of claim 19, wherein said $Cu+(Se,S)$ or $Cu_x(Se,S)$ is deposited at a temperature of about 565° C.

21. The process of claim 10, wherein said additional $(In,Ga)+(Se,S)$ is deposited at a temperature in the range of about 350° C. to 1,200° C.

22. The process of claim 10, wherein said additional $(In,Ga)+(Se,S)$ is deposited at a temperature in the range of about 350° C. to 1,000° C.

23. The process of claim 10, wherein said additional $(In,Ga)+(Se,S)$ is deposited at a temperature of about 565° C.

24. A process for fabricating thin film semiconductor devices, comprising the steps of:
    depositing a seed layer of $(In,Ga)_x(Se,S)_y$ on a substrate;
    depositing $Cu+(Se,S)$ or $Cu_x(Se,S)$ on said layer of $(In,Ga)_x(Se,S)_y$ in sufficient quantity to produce a very Cu-rich composition wherein said Cu-rich composition comprises about $10 < Cu/(In,Ga) < 100$; and
    depositing sufficient additional $(In,Ga)+(Se,S)$ on said Cu-rich composition to produce a slightly Cu-poor composition of thin film $Cu(In,Ga)(Se,S)_2$ wherein said slightly Cu-poor thin film comprises, a composition of about $0.8 < Cu/(In,Ga) < 0.99$.

25. The process of claim 24, wherein said very Cu-rich composition comprises a Cu/(In,Ga) of about 10.

26. The process of claim 24, wherein said slightly Cu-poor thin film comprises $CuInSe_2$ with no Ga and has a Cu/In ratio of about 0.96.

27. The process of claim 24, wherein said slightly Cu-poor thin film comprises a Cu/(In,Ga) ratio of about 0.92.

* * * * *